United States Patent
Tabata et al.

(10) Patent No.: US 12,476,115 B2
(45) Date of Patent: Nov. 18, 2025

(54) METHOD FOR PROCESSING WORKPIECE

(71) Applicant: TOKYO ELECTRON LIMITED, Tokyo (JP)

(72) Inventors: Masahiro Tabata, Miyagi (JP); Toru Hisamatsu, Miyagi (JP); Yoshihide Kihara, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 740 days.

(21) Appl. No.: 17/362,285

(22) Filed: Jun. 29, 2021

(65) Prior Publication Data

US 2021/0327719 A1 Oct. 21, 2021

Related U.S. Application Data

(63) Continuation of application No. 16/347,697, filed as application No. PCT/JP2017/039772 on Nov. 2, 2017, now Pat. No. 11,081,360.

(30) Foreign Application Priority Data

Nov. 7, 2016 (JP) ................................ 2016-217163

(51) Int. Cl.
*H01L 21/306* (2006.01)
*H01J 37/32* (2006.01)
(Continued)

(52) U.S. Cl.
CPC .. *H01L 21/31116* (2013.01); *H01J 37/32091* (2013.01); *H01J 37/321* (2013.01);
(Continued)

(58) Field of Classification Search
CPC .............. H01J 37/321; H01J 2237/334; H01J 37/32091; H01J 37/32449;
(Continued)

(56) References Cited

U.S. PATENT DOCUMENTS 5,286,344 A * 2/1994 Blalock ............. H01L 21/76802
216/72
5,571,366 A * 11/1996 Ishii .................... H01J 37/3299
216/60
(Continued)

FOREIGN PATENT DOCUMENTS

JP 2001-210627 A 8/2001
JP 2004-080033 A 3/2004
(Continued)

OTHER PUBLICATIONS

International Search Report issued in Application No. PCT/JP2017/039772, dated Jan. 23, 2018. (5 pages).

*Primary Examiner* — Luz L Alejandro Mulero
(74) *Attorney, Agent, or Firm* — XSENSUS LLP (57) ABSTRACT

In an embodiment, in the method for processing a workpiece including an etching target layer containing silicon oxide, a mask provided on the etching target layer, and an opening provided in the mask and exposing the etching target layer, according to the embodiment, the etching target layer is etched by removing the etching target layer for each atomic layer through repetitive execution of a sequence of generating plasma of a first processing gas containing nitrogen, forming a mixed layer containing ions included in the plasma on an atomic layer on an exposed surface of the etching target layer, generating plasma of a second processing gas containing fluorine, and removing the mixed layer by radicals included in the plasma. The plasma of the second processing gas contains the radicals that remove the mixed layer containing silicon nitride.

16 Claims, 5 Drawing Sheets

(51) Int. Cl.
*H01L 21/02* (2006.01)
*H01L 21/3065* (2006.01)
*H01L 21/311* (2006.01)
*H05H 1/46* (2006.01)

(52) U.S. Cl.
CPC .. *H01J 37/32192* (2013.01); *H01J 37/32449* (2013.01); *H01L 21/02164* (2013.01); *H01L 21/02329* (2013.01); *H01L 21/02332* (2013.01); *H01L 21/3065* (2013.01); *H01L 21/31144* (2013.01); *H05H 1/46* (2013.01); *H01J 2237/334* (2013.01)

(58) Field of Classification Search
CPC ........... H01J 37/32192; H01L 21/0214; H01L 21/02126; H01L 21/0206; H01L 21/02329; H01L 21/02332; H01L 21/02164; H01L 21/0234
See application file for complete search history.

(56) References Cited

U.S. PATENT DOCUMENTS

| | | | | |
|---|---|---|---|---|
| 5,786,276 A | * | 7/1998 | Brooks | H01L 21/31116 438/719 |
| 5,942,446 A | * | 8/1999 | Chen | H01L 21/31144 438/743 |
| 9,548,303 B2 | * | 1/2017 | Lee | H01L 21/845 |
| 2015/0221518 A1 | * | 8/2015 | Terakura | H01L 21/32137 438/723 |
| 2016/0196969 A1 | * | 7/2016 | Berry, III | H01L 21/02252 438/694 |

FOREIGN PATENT DOCUMENTS

| | | |
|---|---|---|
| JP | 2016015382 A | 1/2016 |
| JP | 2016-127285 A | 7/2016 |
| TW | 201513215 A | 4/2015 |
| TW | 201612965 A | 4/2016 |
| TW | 201635383 A | 10/2016 |

* cited by examiner

METHOD FOR PROCESSING WORKPIECE

CROSS REFERENCE TO RELATED APPLICATIONS

This application is a continuation application of U.S. application Ser. No. 16/347,697, filed on May 6, 2019, which is national phase of PCT application No. PCT/JP2017/039772, filed on Nov. 2, 2017, which claims priority from Japanese Patent Application No. 2016-217163, filed on Nov. 7, 2016, all of which are incorporated herein in their entireties by reference.

TECHNICAL FIELD

An embodiment of the present invention relates to a method of processing a processing target object.

BACKGROUND

There is plasma etching, as a kind of plasma processing on a processing target object using a plasma processing apparatus. A resist mask used for the plasma etching is formed by a photolithography technology, and a critical dimension (CD) of a pattern formed on an etching target layer depends on the resolution of the resist mask formed by the photolithography technology. However, the resolution of the resist mask has a resolution limit. As a demand for high integration of electronic devices gradually increases, it is required to form a pattern with a dimension smaller than the resolution limit of the resist mask. For this reason, as described in Patent Document 1, a technology is suggested in which a silicon oxide film is formed on a resist mask so as to adjust the dimension of the resist mask and reduce the width of an opening provided by the corresponding resist mask,

PRIOR ART DOCUMENT

Patent Document

Patent Document 1: Japanese Patent Laid-Open Publication No. 2004-080033

DISCLOSURE OF THE INVENTION

Problems to be Solved

Meanwhile, according to miniaturization along with high integration of electronic devices in recent years, in a case where etching on, for example, an organic film included in a laminated structure gradually progresses in pattern formation on a. processing target object, a control on a minimum line width (CD: Critical Dimension) with high precision is required. In a case where a fine hole slit of 10 nm or less is perpendicularly provided on a $SiO_2$ film, the selectivity with a mask has conventionally been obtained by using a depositing $C_xF_y$-based gas. However, deposits occurring due to the $C_xF_y$-based gas may cause blockage of an opening of the fine hole slit. Therefore, in a case where the fine hole slit of 10 nm or less is formed on the $SiO_2$ film by using the $C_xF_y$-based gas, trade-off may occur between an etching amount (the depth of a slit formed by etching) and the selectivity. Therefore, in etching on a processing target object containing silicon oxide, a technique of forming a fine hole slit while maintaining a good selectivity with a mask is required.

Means to Solve the Problem

In an aspect, a method for processing a workpiece is provided. The workpiece includes an etching target layer, a mask provided on the etching target layer, and a trench (fine hole slit) provided in the mask, and extending from a top surface of the mask to the etching target layer so as to expose the etching target layer. The method etches the etching target layer by removing the etching target layer, for each atomic layer, through repetitive execution of a sequence, the sequence including: a first process of generating plasma of a first processing gas within a processing container of a plasma processing apparatus where the workpiece is accommodated, and forming a mixed layer containing ions included in the plasma of the first processing gas, on an atomic layer of a surface of the etching target layer through the trench; a second process of purging a space within the processing container after execution of the first process; a third process of generating plasma of a second processing gas within the processing container, and removing the mixed layer by radicals included in the plasma of the second processing gas after execution of the second process; and a fourth process of purging the space within the processing container after execution of the third process. The etching target layer contains silicon oxide, the first processing gas contains nitrogen, and the second processing gas contains fluorine. Also, the plasma of the second processing gas generated in the third process contains the radicals that remove the mixed layer containing silicon nitride.

In the above described method, in the first process of the sequence that is repeatedly executed, first, the mixed layer containing nitrogen ions is formed by the plasma of the first processing gas containing nitrogen, on the top surface of the etching target layer containing silicon oxide, which is exposed through the trench of the mask. The mixed layer contains silicon nitride. Then, in the third process of the sequence, the mixed layer of silicon nitride formed in the first process is removed by using radicals included in the plasma of the second processing gas containing fluorine. In this manner, in the first process in which the nitrogen-containing first gas is used, the mixed layer containing silicon nitride is formed in detail according to the shape of an opening in the trench of the mask, and in the third process in which the fluorine-containing second gas is used, the mixed layer is removed from the etching target layer. Therefore, it heroines possible to etch the etching target layer in a state where the shape of the opening in the trench of the mask is maintained in detail while avoiding formation of deposits on the opening and the side surface of the trench of the mask. It becomes possible to uniformly etch the etching target layer regardless of the width of the trench of the mask or the density of a pattern of the trench of the mask. Also, as such a sequence including the first process and the third process is repeatedly executed, in a state where the shape of the opening in the trench of the mask is maintained in detail, it becomes possible to uniformly etch the etching target layer until a desired depth is reached regardless of the width of the trench of the mask or the density of the pattern of the trench of the mask.

In an embodiment, in the first process, a bias voltage is applied to the plasma of the first processing gas so as to form the mixed layer containing the ions on the atomic layer of the surface of the etching target layer. In this manner, since the bias voltage is applied to the plasma of the first processing gas, the ions (ions of nitrogen atoms) included in the plasma may be anisotropically supplied to the top surface of the etching target layer exposed through the trench of the mask. For this reason, it becomes possible to form the mixed layer, which is to be formed on the top surface of the etching target layer, into a shape that matches the shape of the opening in the trench in high detail when viewed from above the trench.

In the embodiment, the second processing gas may be a mixed gas containing $NF_3$ gas, and $O_2$ gas, a mixed gas containing $NF_3$ gas, $O_2$ gas, $H_2$ gas, and Ar gas, or a mixed gas containing $CH_3F$ gas, $O_2$ gas, and Ar gas. In this manner, the second processing gas containing fluorine may be realized.

Effect of the Invention

As described above, there is provided a technique of forming a fine hole slit while maintaining a good selectivity with a mask, in etching on a processing target object containing silicon oxide.

DETAILED DESCRIPTION TO EXECUTE THE INVENTION

Figure 1:
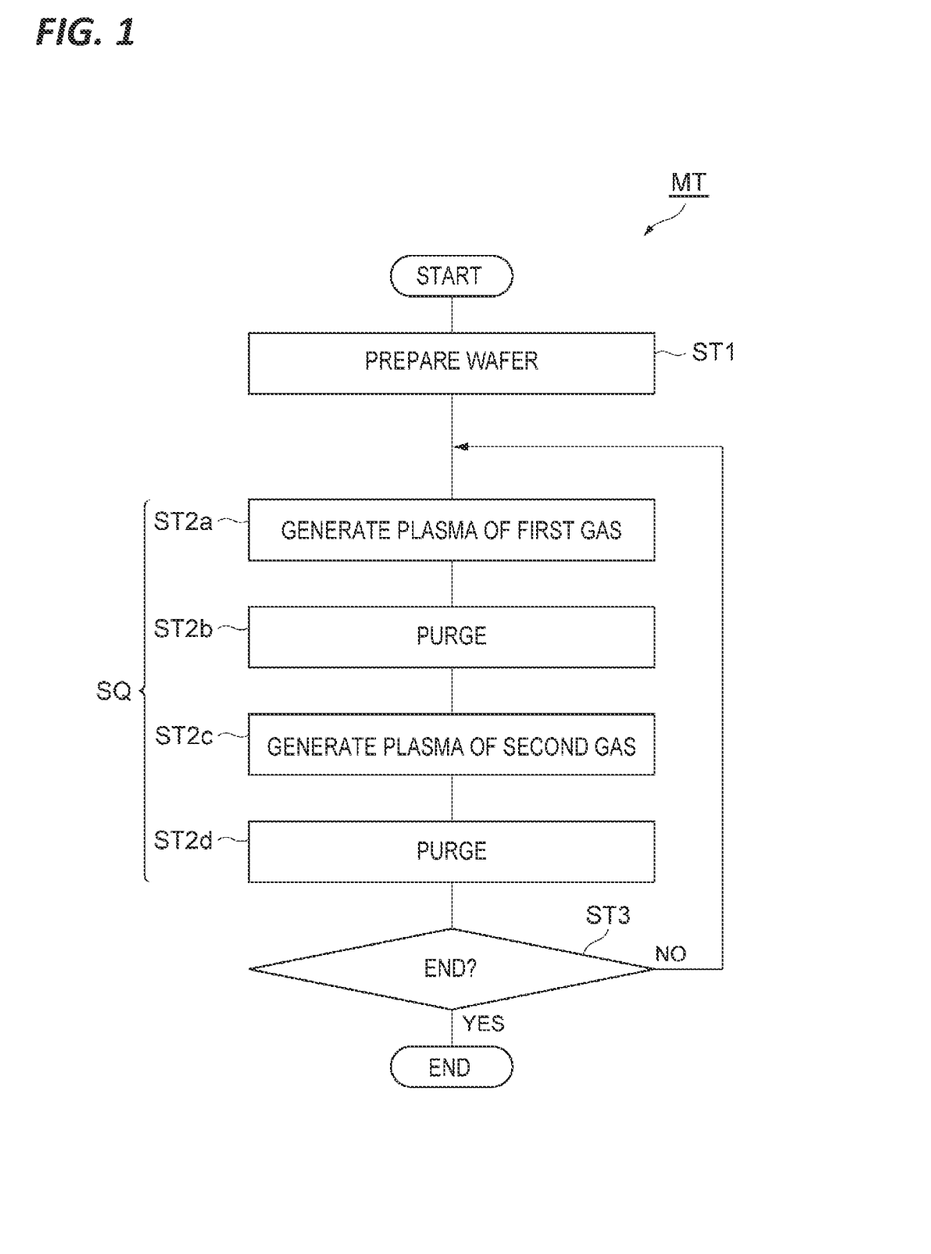
FIG. 1 is a flow chart illustrating a method according to an embodiment.
Figure 2:
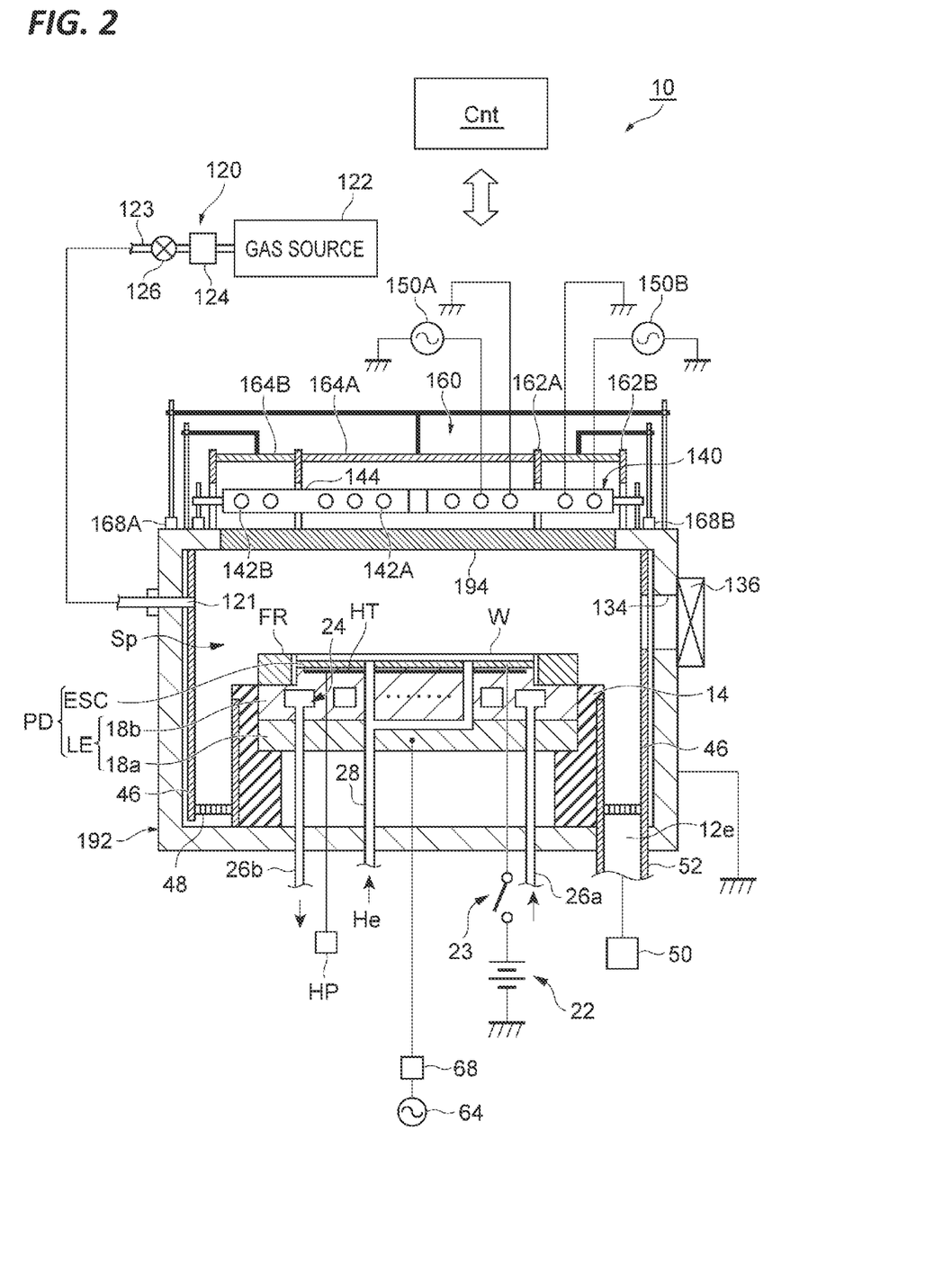
FIG. 2 is a view illustrating an example of a plasma processing apparatus.

Hereinafter, detailed descriptions will be made on various embodiments with reference to drawings. Also, it is assumed that the same or equivalent portions in drawings are denoted by the same reference numerals. Hereinafter, descriptions will be made on an etching method (a method MT) that may be executed by using a plasma processing apparatus 10, with reference to FIG. 1. FIG. 1 is a flow chart illustrating the method (the method MT) in an embodiment. The method MT in the embodiment as illustrated in FIG. 1 is a method of processing a processing target object (hereinafter, referred to as a "wafer" in some cases). The method MT is an example of a method of etching a wafer. In the method MT in the embodiment, it is possible to execute a series of steps by using a single plasma processing apparatus (e.g., the plasma processing apparatus 10 illustrated in FIG. 2), FIG. 2 is a schematic view illustrating the plasma processing apparatus 10 in the embodiment. The plasma processing apparatus 10 illustrated in FIG. 2 includes an inductively coupled plasma (ICP) type plasma source. The plasma processing apparatus 10 includes a processing container 192 that is made of a metal (made of, for example, aluminum) and is formed into a tubular shape (e.g., a cylindrical shape). The processing container 192 defines a processing space Sp where a plasma processing is performed. Also, the shape of the processing container 192 is not limited to the cylindrical shape. For example, a square tubular shape (for example, a box shape) may be employed. Also, the plasma source of the plasma processing apparatus 10 is not limited to the ICP type, and may be, for example, an electron cyclotron resonance (ECR) type, a capacitively coupled plasma (CCP) type, or one using microwaves.

A placing table PD on which a wafer W is placed is provided on the bottom portion of the processing container 192. The placing table PD includes an electrostatic chuck ESC and a lower electrode LE. The lower electrode LE includes a first plate 18a and a second plate 18b. The processing container 192 defines the processing space Sp.

A support 14 is provided on the bottom portion of the processing container 192, within the processing container 192. The support 14 has, for example, a substantially cylindrical shape. The support 14 is made of, for example, an insulating material. Like quartz, the insulating material constituting the support 14 may include oxygen. The support 14 extends in the vertical direction from the bottom portion of the processing container 192, within the processing container 192.

The placing table PD is provided within the processing container 192. The placing table PD is supported by the support 14. The placing table PD holds the wafer W on the top surface of the placing table PD. The wafer W is a processing target object. The placing table PD includes the lower electrode LE and the electrostatic chuck ESC.

The lower electrode LE includes the first plate 18a and the second plate 18b. The first plate 18a and the second plate 18b are made of, for example, a metal such as aluminum. The first plate 18a and the second plate 18b have, for example, substantially disc shapes. The second plate 18b is provided on the first plate 18a. The second plate 18b is electrically connected to the first plate 18a.

The electrostatic chuck ESC is provided on the second plate 18b. The electrostatic chuck ESC includes a structure in which an electrode of a conductive film is disposed between a couple of insulating layers, or between a couple of insulating sheets. A DC power supply 22 is electrically connected to the electrode of the electrostatic chuck ESC via a switch 23. The electrostatic chuck ESC attracts the wafer W by an electrostatic force generated by a DC voltage from the DC power supply 22. Accordingly, the electrostatic chuck ESC may hold the wafer W.

A focus ring FR is disposed on the peripheral portion of the second plate 18b so as to surround the edge of the wafer W, and the electrostatic chuck ESC. The focus ring FR is provided to improve the uniformity of etching. The focus ring FR is made of a material properly selected depending on a material of a film to be etched, and may be made of, for example, quartz.

A refrigerant flow path 24 is provided inside the second plate 18b. The refrigerant flow path 24 constitutes a temperature control mechanism. A refrigerant is supplied to the refrigerant flow path 24 through a pipe 26a from a chiller unit provided outside the processing container 192. The refrigerant supplied to the refrigerant flow path 24 is returned to the chiller unit through a pipe 26b. In this manner, the refrigerant is supplied to the refrigerant flow path 24 so as to be circulated. By controlling the temperature of the refrigerant, the temperature of the wafer W supported by the electrostatic chuck ESC is controlled. A gas supply line 28 supplies a heat transfer gas, for example, a He gas, between the top surface of the electrostatic chuck ESC and the rear surface of the wafer W, from a heat transfer gas supply mechanism.

A heater HT is a heating element. The heater HT is embedded within, for example, the second plate 18b. A heater power supply HP is connected to the heater HT. By supplying power from the heater power supply HP to the heater HT, the temperature of the placing table PD is adjusted, and the temperature of the wafer W placed on the placing table PD is adjusted. Also, the heater HT may be incorporated in the electrostatic chuck ESC.

A plate-like dielectric 194 is disposed to face the placing table PD above the placing table PD. The lower electrode LE and the plate-like dielectric 194 are provided substantially in parallel to each other. The processing space Sp is provided between the plate-like dielectric 194 and the lower electrode LE. The processing space Sp is a space area where a plasma processing is performed on the wafer W.

In the plasma processing apparatus 10, a deposition shield 46 is detachably provided along the inner wall of the processing container 192. The deposition shield 46 is also provided on the outer periphery of the support 14. The deposition shield 46 prevents etching by-product (deposition) from adhering to the processing container 192, and may be configured by coating an aluminum material with ceramic such as $Y_2O_3$. The deposition shield may be made of an oxygen-containing material, such as, for example, quartz, besides $Y_2O_3$.

An exhaust plate 48 is provided on the bottom portion side of the processing container 192. and between the support 14 and the side wall of the processing container 192. The exhaust plate 48 may be configured by coating, for example, an aluminum material with ceramic such as $Y_2O_3$. An exhaust port 12e is provided in the processing container 192 below the exhaust plate 48. An exhaust device 50 is connected to the exhaust port 12e through an exhaust pipe 52. The exhaust device 50 includes a vacuum pump such as a turbo molecular pump, and may depressurize the space within the processing container 192 to a desired degree of vacuum. A radio frequency power supply 64 is a power supply that generates a second radio frequency power for pulling ions into the wafer W, that is, a radio frequency bias power, and generates a radio frequency bias power at a frequency in a range from 400 kHz to 40.68 MHz, in an example, 13 MHz. The radio frequency power supply 64 is connected to the lower electrode LE via a matching unit 68. The matching unit 68 is a circuit that matches an output impedance of the radio frequency power supply 64 to an input impedance on a load side (the lower electrode LE side).

The plate-like dielectric 194 made of, for example, quartz glass or ceramic is provided to face the placing table PD, in a ceiling portion of the processing container 192. Specifically, the plate-like dielectric 194 is formed in, for example, a disc shape, and is air-tightly attached so as to close an opening formed in the ceiling portion of the processing container 192. The processing space Sp is a space where plasma is generated by a plasma source. The processing space Sp is space where the wafer W is placed.

In the processing container 192, a gas supply unit 120 is provided to supply a first processing gas and a second processing gas to be described below. The gas supply unit 120 supplies the first processing gas and the second processing gas to the above described processing space Sp. A gas inlet 121 is formed in the side wall portion of the processing container 192, and a gas source 122 is connected to the gas inlet 121 through a gas supply pipe 123. A flow rate controller (for example, a mass flow controller 124 and an open/close valve 126) that controls flow rates of the first processing gas and the second processing gas is interposed in the middle of the gas supply pipe 123. By such a gas supply unit 120, the first processing gas and the second processing gas output from the gas source 122 are controlled to flow rates set in advance by the mass flow controller 124, and supplied from the gas inlet 121 to the processing space Sp of the processing container 192.

In FIG. 2, the gas supply unit 120 is expressed by using a one-system gas line in order to simplify the description. However, the gas supply unit 120 includes a configuration in which a plurality of gas species (at least, the first processing gas and the second processing gas) is supplied as processing gases. Also, the gas supply unit 120 illustrated in FIG. 2 includes, as an example, a configuration in which a gas is supplied from the side wall portion of the processing container 192, but the gas supply unit 120 is not limited to the configuration illustrated in FIG. 2, For example, the gas supply unit 120 may also include a configuration in which a gas is supplied from the ceiling portion of the processing container 192. In a case where the gas supply unit 120 includes such a configuration, for example, a gas inlet may be formed in, for example, the central portion of the plate-like dielectric 194, and a gas may be supplied from the gas inlet.

The exhaust device 50 that exhausts the atmosphere within the processing container 192 is connected to the bottom portion of the processing container 192 through the exhaust pipe 52. The exhaust device 50 is constituted by, for example, a vacuum pump, and may set the pressure within the processing container 192, to a preset pressure.

A wafer loading/unloading port 134 is provided in the side wall portion of the processing container 192, and a gate valve 136 is provided in the wafer loading/unloading port 134. For example, when the water W is loaded, the gate valve 136 is opened. After the wafer W is placed on the placing table PD within the processing container 192 by a conveyance mechanism (not illustrated) such as a. conveyance arm, the gate valve 136 is closed, and a processing of the wafer W is started.

A planar radio frequency antenna 140 and a shield member 160 covering the radio frequency antenna 140 are provided on the top surface outer surface) of the plate-like dielectric 194, in the ceiling portion of the processing container 192. The radio frequency antenna 140 in the embodiment includes an inner antenna element 142A disposed in the central portion of the plate-like dielectric 194, and an outer antenna element 142B disposed to surround the outer periphery of the inner antenna element 142A. Each of the inner antenna element 142A and the outer antenna element 142B is a conductor such as, for example, copper, aluminum, or stainless steel, and has a spiral coil-like shape.

Both the inner antenna element 142A and the outer antenna element 142B are clamped by a plurality of clamping bodies 144 so as to be integrated. The clamping body 144 has, for example, a rod-like shape. The clamping bodies 144 are radially arranged so as to protrude from the vicinity of the center of the inner antenna element 142A toward the outside of the outer antenna element 142B.

The shield member 160 includes an inner shield wall 162A and an outer shield wall 162B. The inner shield wall 162A is provided between the inner antenna element 142A and the outer antenna element 142B to surround the inner antenna element 142A. The outer shield wall 162B is provided to surround the outer antenna element 142B, and has a tubular shape. Therefore, the top surface of the plate-like dielectric 194 is divided into the central portion (central zone) inside the inner shield wall 162A, and the peripheral portion (peripheral zone) between the inner shield wall 162A and the outer shield wall 162B.

A disc-shaped inner shield plate 164A is provided on the inner antenna element 142A so as to close an opening of the inner shield wall 162A. A donut plate-shaped outer shield plate 164B is provided on the outer antenna element 142B so as to close an opening between the inner shield wall 162A and the outer shield wall 162B.

The shape of the shield member 160 is not limited to the cylindrical shape. The shape of the shield member 160 may be another shape such as, for example, a square tubular shape, or may be one matched to the shape of the processing container 192. Here, since the processing container 192 has, for example, a substantially cylindrical shape, the shield member 160 also has a substantially cylindrical shape in accordance with the cylindrical shape. In a case where the processing container 192 has a substantially square tubular shape, the shield member 160 also has a substantially square tubular shape.

Each of a radio frequency power supply 150A and a radio frequency power supply 150B is individually connected to each of the inner antenna element 142A and the outer antenna element 142B. Accordingly, it is possible to apply radio frequencies at the same frequencies or different frequencies to the inner antenna element 142A and the outer antenna element 142B, respectively. For example, when a radio frequency at a frequency of, for example, 27 MHz is supplied from the radio frequency power supply 150A to the inner antenna element 142A at a preset power [W], a processing gas introduced into the processing container 192 is excited by an induced magnetic field formed within the processing container 192 so that donut-shaped plasma may be generated in the central portion on the wafer W. Also, when a radio frequency at a frequency of, for example, 27 MHz is supplied from the radio frequency power supply 150B to the outer antenna element 142B at a preset power [W], a processing gas introduced into the processing container 192 is excited by an induced magnetic field formed within the processing container 192 so that separate donut-shaped plasma may be generated in the peripheral portion on the wafer W. The radio frequency output from each of the radio frequency power supply 150A and the radio frequency power supply 150B is not limited to the above described frequency, and radio frequencies at various frequencies may be supplied from each of the radio frequency power supply 150A and the radio frequency power supply 150B. Also, it is required to adjust the electrical lengths of the inner antenna element 142A and the outer antenna element 142B, according to the radio frequency output from each of the radio frequency power supply 150A and the radio frequency power supply 150B. The heights of the inner shield plate 164A and the outer shield plate 164B may be separately adjusted by an actuator 168A and an actuator 168B, respectively.

A controller Cnt is a computer that includes, for example, a processor, a storage, an input device, and a display device, and controls respective units of the plasma processing apparatus 10, Specifically, the controller Cm is connected to the mass flow controller 124, the open/close valve 126, the exhaust device 50, the radio frequency power supply 150A, the radio frequency power supply 150B, the radio frequency power supply 64, the matching unit 68, the heater power supply HP, and the chiller unit.

The controller Cnt operates according to a program based on an input recipe, and sends a control signal. By the control signal from the controller Cnt, at least, it is possible to control a selection and a flow rate of a gas supplied from the gas source 122, exhaust of the exhaust device 50, power supply from the radio frequency power supply 150A, the radio frequency power supply 150B, and the radio frequency power supply 64, power supply of the heater power supply HP, a refrigerant flow rate from the chiller unit, and a refrigerant temperature. Also, each of steps in the method of processing the processing target object (the method MT illustrated in FIG. 1), as disclosed in the present specification, may be executed by operating respective units of the plasma processing apparatus 10 under a control by the controller Cnt.

Figure 4:
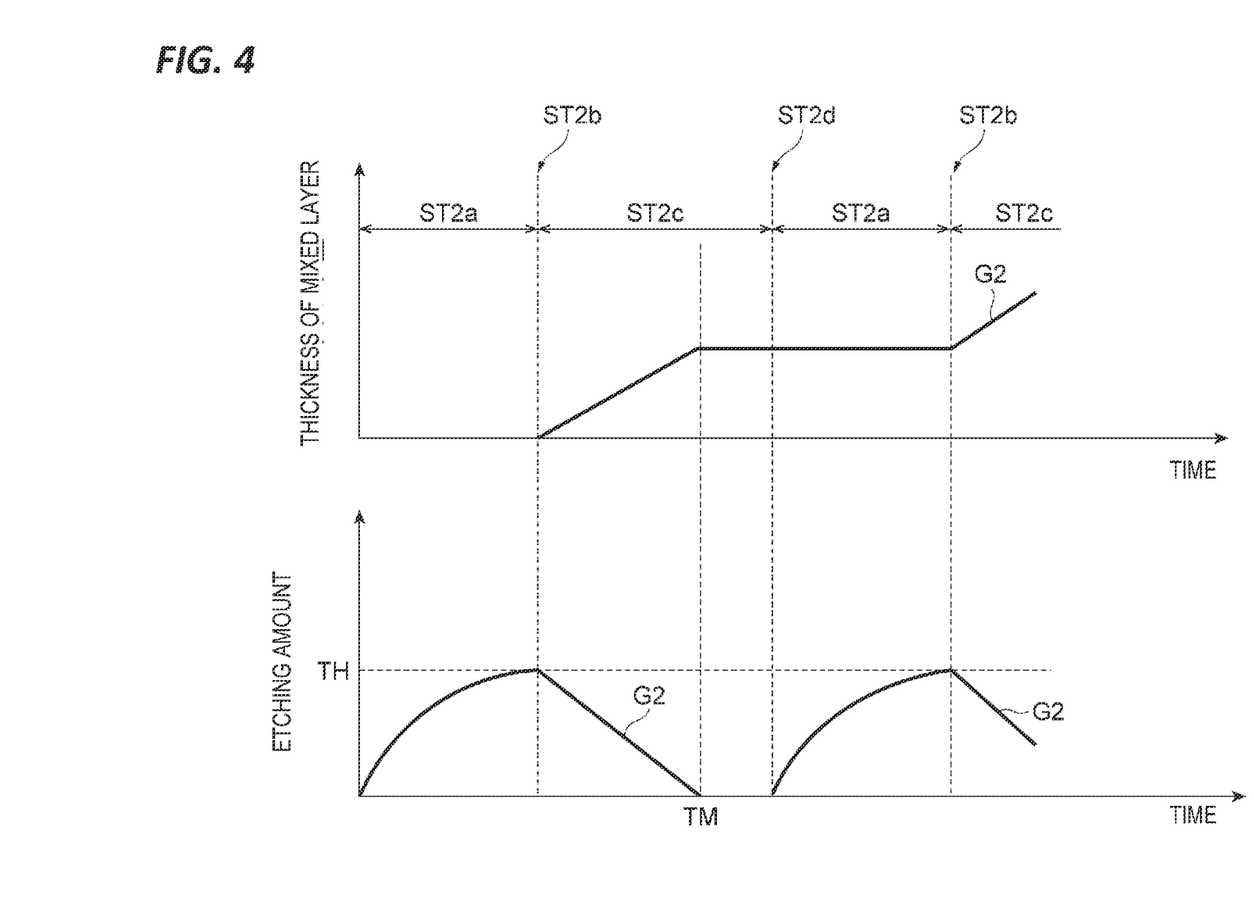
FIG. 4 is a view illustrating changes of an etching amount on an etching target layer and a thickness of a mixed layer formed on the etching target layer during execution of the method illustrated in FIG. 1.
Figure 5A:
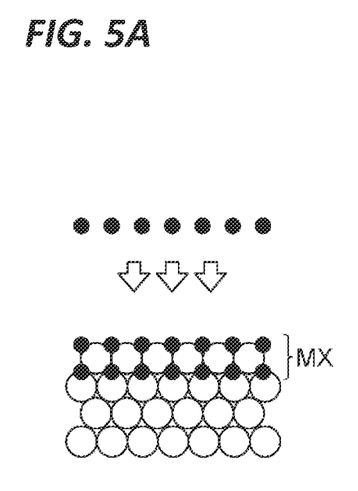
FIGS. 5A to 5C are views illustrating the principle of etching in the method illustrated in FIG. 1.
Figure 5B:
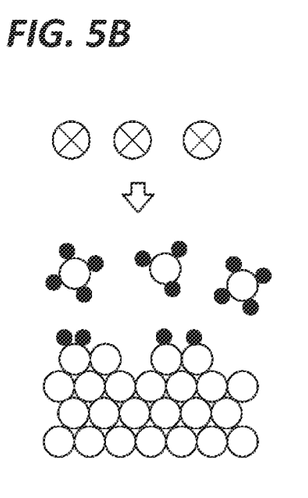
Figure 5C:
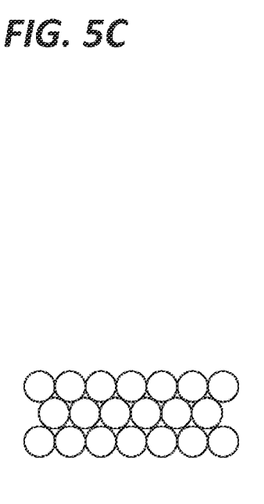

Returning to FIG. 1, descriptions on the method MT will be continued. In the following description, descriptions will be made with reference to FIG. 2, FIGS. 3A to 3D, FIG. 4, and FIGS. 5A to 5C together with FIG. 1. FIGS. 3A to 3D are sectional views illustrating the state of the processing target object before execution of each of steps illustrated in FIG. 1 and after execution. FIG. 4 is a view illustrating changes of an etching amount on an etching target layer and a thickness of a mixed layer formed on the etching target layer during execution of the method illustrated in FIG. 1. FIGS. 5A to 5C are views illustrating the principle of etching in the method illustrated in FIG. 1.

Figure 3A:
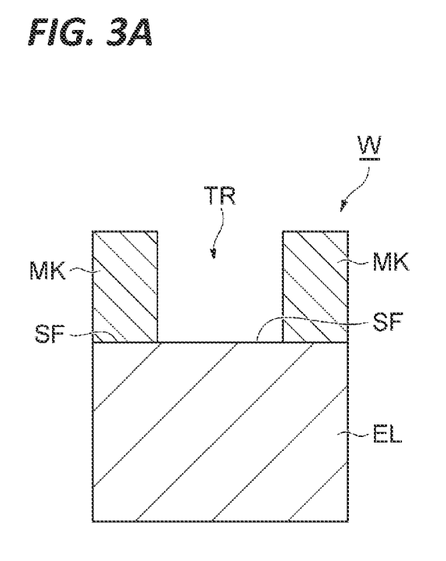
FIGS. 3A to 3D are sectional views illustrating the state of a processing target object before execution of each of steps illustrated in FIG. 1 and after execution.

In step ST1, a wafer W illustrated in FIG. 3A is prepared, and the wafer W is accommodated within the processing container 192 of the plasma processing apparatus 10, and is placed on the electrostatic chuck ESC. After the above described wafer W illustrated in FIG. 3A is prepared as the wafer W illustrated in FIG. 2 in step ST1, each of steps in a sequence SQ and step ST3 is executed. The wafer W illustrated in FIG. 3A includes a support substrate (not illustrated), an etching target layer EL provided on the support substrate, a mask MK provided on the etching target layer EL (a top surface SF of the etching target layer EL), and a trench TR provided in the mask MK. The trench TR reaches from the top surface of the mask MK to the top surface SF of the etching target layer EL so as to expose the etching target layer EL. That is, a part of the top surface SF of the etching target layer EL is exposed through the trench TR. A material of the etching target layer EL contains silicon oxide and may contain, for example, $SiO_2$. A material of the mask MK may contain, for example, TiN.

A series of steps in the sequence SQ and step ST3 subsequent to step ST1 corresponds to steps of etching the etching target layer EL. First, subsequently to step ST1, the sequence SQ is executed once (unit cycle) or more. The sequence SQ is a series of steps of precisely etching an area in the etching target layer EL not covered with the mask MK at a high selectivity regardless of density of the mask MK in accordance with the same method as an atomic layer etching (ALE) method, and includes step ST2a (a first step), step ST2b (a second step), step ST2c (a third step), and step ST2d (a fourth step) which are sequentially executed in the sequence SQ.

Figure 3B:
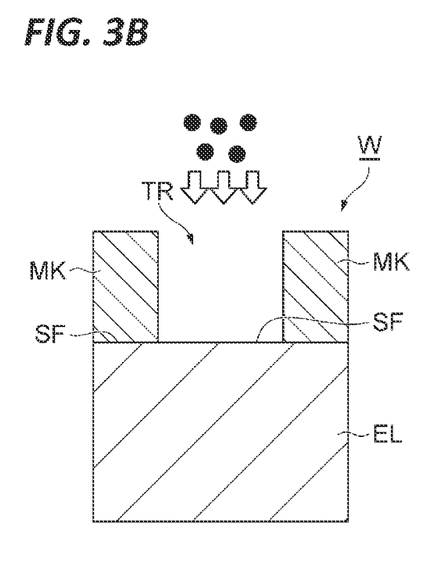

In step ST2a, plasma of a first processing gas is generated within the processing container 192 of the plasma processing apparatus 10 where the wafer W is accommodated, and a mixed layer MX containing ions included in the plasma of the first processing gas is formed on an atomic layer on the top surface SF of the etching target layer EL through the trench TR. For example, in step ST2a, a bias voltage is applied to the plasma of the first processing gas through the radio frequency power supply 64 so that the mixed layer MX containing the ions included in the plasma of the first processing gas may be formed with respect to the atomic layer on the top surface SF of the etching target layer EL. In step ST2a, as illustrated in FIG. 3B, in a state where the wafer W is placed on the electrostatic chuck ESC, the first processing gas is supplied into the processing container 192 and the plasma of the first processing gas is generated. The first processing gas contains nitrogen, and specifically may contain $N_2$ gas. Black-colored circles (black circles) illustrated in the FIG. 3B indicate the ions (ions of nitrogen atoms) included in the plasma of the first gas. Specifically, the first processing gas containing $N_2$ gas is supplied into the processing container 192 from a gas source selected among a plurality of gas sources of the gas source 122. Then, a radio frequency power is supplied from the radio frequency power supply 150A and the radio frequency power supply 150B, a radio frequency bias voltage is supplied from the radio frequency power supply 64, and the exhaust device 50 is operated to set an atmospheric pressure of the processing space Sp within the processing container 192 to a preset value. In this manner, the plasma of the first processing gas is generated within the processing container 192, and the ions (ions of nitrogen atoms) included in the plasma of the first processing gas are drawn in the vertical direction by a radio frequency bias power and come in contact with the top surface SF of the etching target layer EL through the trench TR. Then, the top surface SF of the etching target layer EL exposed through the trench TR is anisotropically modified. In this manner, a portion in the top surface SF of the etching target layer EL, which is anisotropically modified in step ST2a, becomes the mixed layer MX. Since the first gas is $N_2$ gas, and the etching target layer EL contains silicon oxide (for example, $SiO_2$), a composition of the mixed layer MX may be $SiN/SiO_2(SiON)$.

FIGS. 5A to 5C are views illustrating the principle of etching in the method (sequence SQ) illustrated in FIG. 1. In FIGS. 5A to 5C, white circles (white circles) indicate atoms constituting the etching target layer EL (for example, atoms constituting $SiO_2$), black-colored circles (black circles) indicate ions (ions of nitrogen atoms) included in plasma of the first gas, and "x" surrounded by a circle indicates a radical included in plasma of a second gas as described below. As illustrated in FIG. 5A and FIG. 3B, in step ST2a, the ions [black-colored circles (black circles)] of nitrogen atoms included in the plasma of the first gas are anisotropically supplied to the atomic layer on the top surface SF of the etching target layer EL, through the trench TR, In this manner, in step ST2a, the mixed layer MX containing the atoms constituting the etching target layer EL and the nitrogen atoms of the first gas is formed on the atomic layer on the top surface SF of the etching target layer EL exposed by the trench TR (see also FIG. 3C together with FIG. 5A).

As described above, since the first gas contains $N_2$ gas, in step ST2a, the nitrogen atoms are supplied to the atomic layer on the top surface SF of the etching target layer EL (the atomic layer of silicon oxide). Then, the mixed layer MX ($SiN/SiO_2$) containing silicon nitride may be formed on the atomic layer on the top surface SF.

In step ST2b subsequent to step ST2a, the processing space Sp within the processing container 192 is purged. Specifically, the first processing gas supplied in step ST2a is exhausted. In step ST2b, an inert gas called a rare gas (for example, Ar gas) may be supplied to the processing container 192, as a purge gas. That is, purging in step ST2b may be either gas purging that causes an inert gas to flow into the processing container 192, or purging by a vacuuming processing.

Figure 3C:
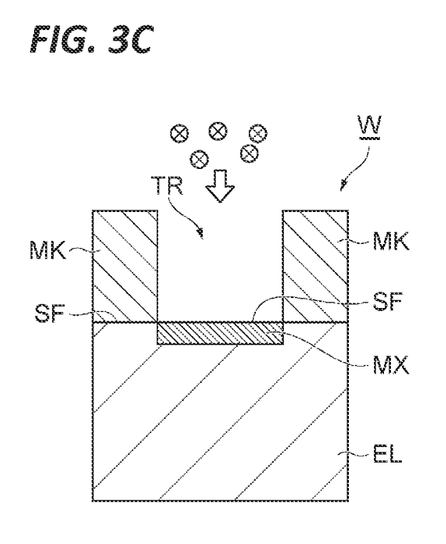
Figure 3D:
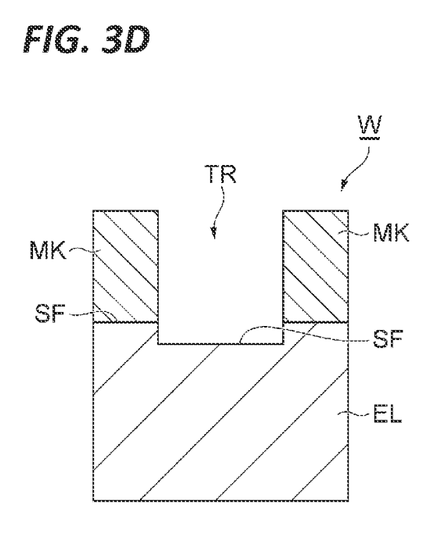

In step ST2c subsequent to step ST2b, plasma of a second processing gas is generated within the processing container 192, and the mixed layer MX is removed by chemical etching using radicals included in the plasma. In step ST2c, as illustrated in FIG. 3C, in a state where the wafer W on which the mixed layer MX is formed in step ST2a is placed on the electrostatic chuck ESC, the second processing gas is supplied into the processing container 192, and the plasma of the second processing gas is generated. The plasma of the second processing gas, which is generated in step ST2c, contains radicals that remove the mixed layer MX containing silicon nitride. "x" surrounded by a circle illustrated in FIG. 3C indicates a radical included in the plasma of the second gas. The second processing gas contains fluorine, and may be, for example, a mixed gas containing $NF_3$ gas and $O_2$ gas. Also, the second processing gas may be a mixed gas containing $NF_3$ gas, $O_2$ gas, $H_2$ gas, and Ar gas, or a mixed gas containing $CH_3F$ gas, $O_2$ gas, and Ar gas. Specifically, the second processing gas is supplied into the processing container 192 from a gas source selected among a plurality of gas sources of the gas source 122. Then, a radio frequency power is supplied from the radio frequency power supply 150A and the radio frequency power supply 150B, and the exhaust device 50 is operated to set an atmospheric pressure of the processing space Sp within the processing container 192 to a preset value. In this manner, the plasma of the second processing gas is generated within the processing container 192. The radicals in the plasma of the second processing gas generated in step ST2c come in contact with the mixed layer MX on the top surface SF of the etching target layer EL through the trench TR. As illustrated in FIG. 5B, in step ST2c, the radicals of atoms of the second processing gas are supplied to the mixed layer MX formed on the top surface SF of the etching target layer EL so that the mixed layer MX may be removed from the etching target layer EL by chemical etching.

As described above, as illustrated in the FIG. 3D, in step ST2c, the mixed layer MX formed on the top surface SF of the etching target layer EL may be removed from the top surface SF of the etching target layer EL by the radicals included in the plasma of the second processing gas.

In step ST2d subsequent to step ST2c, the processing space Sp within the processing container 192 is purged. Specifically, the second processing gas supplied in step ST2c is exhausted. In step ST2d, an inert gas called a rare gas (for example, Ar gas) may be supplied to the processing container 192, as a purge gas. That is, purging in step ST2d may be either gas purging that causes an inert gas to flow into the processing container 192, or purging by a vacuuming processing.

In step ST3 subsequent to the sequence SQ, it is determined whether to end execution of the sequence SQ. Specifically, in step ST3, it is determined whether the number of times of execution of the sequence SQ has reached a preset number of times. The determination on the number of times of execution of the sequence SQ is to determine an etching amount on the etching target layer EL (the depth of a trench (e.g., an opening) formed in the etching target layer EL by etching). The sequence SQ may be repeatedly executed such that the etching target layer EL is etched until the etching amount on the etching target layer EL reaches a preset value. As the number of times of execution of the sequence SQ increases, the etching amount on the etching target layer EL also increases (substantially linearly increases). Therefore, the number of times of execution of the sequence SQ may be determined such that the product of the thickness of the etching target layer EL etched by execution of the sequence SQ at once (unit cycle) (the thickness of the mixed layer MX formed in step ST2a at once) and the number of times of execution of the sequence SQ becomes a preset value.

With reference to FIG. 4, descriptions will be made on a change of an etching amount on the etching target layer EL, and a change of a thickness of the mixed layer MX formed on the etching target layer EL, which occur during execution of the sequence SQ. A graph G1 in FIG. 4 illustrates the change of the etching amount (an arbitrary unit) on the etching target layer EL, which occurs during execution of the sequence SQ, and a graph G2 in FIG. 4 illustrates the change of the thickness (an arbitrary unit) of the mixed layer MX formed on the etching target layer EL, which occurs during execution of the sequence SQ. The horizontal axis in FIG. 4 indicates the time during the execution of the sequence SQ, but an execution time of step ST2b and an execution time of step ST2d are omitted for simplification of illustration. As illustrated in FIG. 4, in the execution of the sequence SQ at once (exit cycle), the execution of step ST2a is performed until the thickness of the mixed layer MX becomes a preset value TH as illustrated in the graph G2. The value TH of the thickness of the mixed layer MX formed in step ST2a may be determined by a value of a bias power applied by the radio frequency power supply 64, a dose amount (dose) of ions included in the plasma of the first gas with respect to the etching target layer EL per unit time, and an execution time of step ST2a.

Also, as illustrated in FIG. 4, in the execution of the sequence SQ at once (unit cycle), the execution of step ST2c is performed until all of the mixed layer MX formed in step ST2a is removed as illustrated in the graph G1 and the graph G2. Until a timing TM is reached during execution of step ST2c, all of the mixed layer MX is removed by chemical etching. The timing TM may be determined by an etching rate of chemical etching performed in step ST2c. The timing TM occurs during execution of step ST2c. Between the timing TM and the end of step ST2c, the etching target layer EL of silicon oxide after removal of the mixed layer MX is not etched by the plasma of the second processing gas (self-limited). That is, in a case where the radicals included in the plasma of the second processing gas are used, an etching rate of etching on silicon oxide (for example, $SiO_2$) constituting the etching target layer EL is very small as compared to an etching rate of etching on silicon nitride (for example, SiN) included in the mixed layer MX.

In a case where it is determined that the number of times of execution of the sequence SQ has not reached the preset number of times in step ST3 (step ST3: NO), the execution of the sequence SQ is repeated again. Meanwhile, in a case where it is determined that the number of times of execution of the sequence SQ has reached the preset number of times in step ST3 (step ST3: YES), the execution of the sequence SQ is ended. The series of steps in the sequence SQ and step ST3 corresponds to steps of removing the etching target layer EL, for each atomic layer, by repeatedly executing the sequence SQ by using the mask MK so as to precisely etch the etching target layer EL regardless of the density of a pattern of the mask MK or the degree (value) of a width of the trench TR. That is, as the sequence SQ is repeated the preset number of times, the etching target layer EL is etched in detail with a uniform width that is the same as the width of the trench TR provided by the mask MK, regardless of the density of the pattern of the mask MK or the degree (value) of the width of the trench TR, and selectivity to the mask MK is also improved. As described above, in the series of steps in the sequence SQ and step ST3, the etching target layer EL may be removed for each atomic layer in accordance with the same method as an ALE method.

Hereinafter, descriptions will be made on an example under main process conditions in each of step ST2a and step ST2c.

<Step ST2a>
a pressure [mTorr] within the processing container 192: 30 mTorr
a value [W] of a radio frequency power of the radio frequency power supply 150A and the radio frequency power supply 150B: 0 W (27 MHz)
a value [W] of a radio frequency power of the radio frequency power supply 64: 0 to 200 W (13 MHz)
a first processing gas: $N_2$ gas
a flow rate [sccm] of the first processing gas: 500 sccm
a processing time [s]: 10 to 60 s It may be desirable that the value of the radio frequency power of the radio frequency power supply 64 ranges from 20 to 100 W. The inventors have found that in a case where the value of the radio frequency power of the radio frequency power supply 64 falls within the range, it is possible to sufficiently reduce an amount of sputtering by the plasma of the first processing gas with respect to the etching target layer EL while maintaining a relatively large amount of etching of silicon nitride to silicon oxide in the etching target layer EL.

<Step ST2c>
a pressure [mTorr] within the processing container 192: 50 to 400 mTorr
a value [W] of a radio frequency power of the radio frequency power supply 150A and the radio frequency power supply 150B: 0 to 800 W (27 MHz)
a value [W] of a radio frequency power of the radio frequency power supply 64: 0 W (13 MHz)
a second processing gas: a mixed gas containing $NF_3$ gas and $O_2$ gas
a flow rate [sccm] of the second processing gas: 120 sccm ($NF_3$ gas), 40 sccm ($O_2$ gas)
a processing time [s]: 10 to 50 s Also, the inventors have found a phenomenon in which the higher the pressure within the processing container 192, the larger (the higher) an etching amount (selectivity) of silicon nitride to silicon oxide, and also after all of the mixed layer MX is removed by etching, even though step ST2c is continued, an etching amount on the etching target layer EL is reduced.

Also, in step ST2c, the second processing gas may be a mixed gas of $NF_3$ gas, gas, $H_2$ gas, and Ar gas. In a case where this second processing gas is used, in step ST2c, the following process conditions may be used.
a pressure [mTorr] within the processing container 192: 350 mTorr
a value [W] of a radio frequency power of the radio frequency power supply 150A and the radio frequency power supply 150B: 200 W (27 MHz)
a value [W] of a radio frequency power of the radio frequency power supply 64: 0 W (13 MHz)
a second processing gas: a mixed gas containing $NF_3$ gas and $O_2$ gas
a flow rate [sccm] of the second processing gas: 45 sccm ($NF_3$ gas), 300 sccm ($O_2$ gas), 40 sccm ($H_2$ gas), 100 sccm (Ar gas)
a processing time [s]: 10 s <Sequence SQ>
the number of times of repetition: 20 to 50 times Also, as the number of times of repetition of the sequence SQ increases, the etching amount on the etching target layer EL also increases.

In the plasma processing apparatus 10 according to the embodiment as described above, descriptions have been made with an ICP-type plasma source as an example. However, the plasma source of the plasma processing apparatus 10 is not limited to the ICP type, and a CCP type may also be used. Hereinafter, descriptions will be made on an example under main process conditions in each of step ST2a and step ST2c in a case where the plasma source of the plasma processing apparatus 10 is the CCP type.

<Step ST2a>
a pressure [mTorr] within the processing container 192: 10 mTorr
a value [W] of a radio frequency power of a radio frequency power supply provided in the ceiling portion of the processing container 192: 500 W (60 MHz)
a value [W] of a radio frequency power of the radio frequency power supply 64: 100 W (13 MHz)
a first processing gas: $N_2$ gas
a flow rate [sccm] of the first processing gas: 500 sccm
a processing time [s]: 60 s <Step ST2c>
a pressure [mTorr] within the processing container 192: 50 mTorr
a value [W] of a radio frequency power of a radio frequency power supply provided in the ceiling portion of the processing container 192: 1000 W (60 MHz)
a value [W] of a radio frequency power of the radio frequency power supply 64: 0 to 100 W (13 MHz)
a second processing gas: a mixed gas containing $CH_3F$ gas, $O_2$ gas, and Ar gas
a flow rate [sccm] of the second processing gas: 25 sccm ($CH_3F$ gas), 20 sccm ($O_2$ gas), 700 sccm (Ar gas)
a processing time [s]: 60 s After all of the mixed layer MX is removed by etching, even though step ST2c is continued, an etching amount on the etching target layer EL is small. Also, in the sequence SQ, after step ST2c, in some cases, an asking processing is further performed under the following process conditions.

<Ashing processing>
a pressure [mTorr] within the processing container 192: 100 mTorr
a value [W] of a radio frequency power of a radio frequency power supply provided in the ceiling portion of the processing container 192: 600 W (60 MHz)
a value [W] of a radio frequency power of the radio frequency power supply 64: 0 W (13 MHz)
a second processing gas: $O_2$ gas
a flow rate [sccm] of the second processing gas: 750 sccm
a processing time [s]: 60 s In the above described method MT, in step ST2a of the sequence SQ that is repeatedly executed, first, the mixed layer MX containing nitrogen ions is formed by the plasma of the first processing gas containing nitrogen, on the top surface SF of the etching target layer EL containing silicon oxide, which is exposed through the trench TR of the mask MK. The mixed layer MX contains silicon nitride. Then, in step ST2c of the sequence SQ, the mixed layer MX of silicon nitride formed in step ST2a is removed by using radicals included in the plasma of the second processing gas containing fluorine. In this manner, in step ST2a, in which the nitrogen-containing first gas is used, the mixed layer MX containing silicon nitride is formed in detail according to the shape of an opening in the trench TR of the mask MK, and in step ST2c in which the fluorine-containing second gas is used, the mixed layer MX is removed from the etching target layer EL, Therefore, it becomes possible to etch the etching target layer EL in a state where the shape of the opening in the trench TR of the mask MK is maintained in detail while avoiding formation of deposits on the opening and the side surface of the trench TR of the mask MK. it becomes possible to uniformly etch the etching target layer EL regardless of the width of the trench TR. of the mask MK or the density of a pattern of the trench TR. of the mask MK. Also, as such a sequence SQ including step ST2a and step ST2c is repeatedly executed, in a state where the shape of the opening in the trench TR of the mask MK is maintained in detail, it becomes possible to uniformly etch the etching target layer EL until a desired depth is reached regardless of the width of the trench TR of the mask MK or the density of the pattern of the trench TR of the mask MK.

Also, in a case where a bias voltage is applied to the plasma of the first processing gas, ions (ions of nitrogen atoms) included in the plasma may be anisotropically supplied to the top surface SF of the etching target layer EL exposed through the trench TR of the mask MK. For this reason, it becomes possible to form the mixed layer MX, which is to be formed on the top surface SF of the etching target layer EL, into a shape that matches the shape of the opening in the trench TR in high detail when viewed from above the trench TR.

As described above, the principle of the present invention has been illustrated and described in an appropriate embodiment. However, it will be understood by those skilled in the art that the present invention may be varied in arrangement and details without departing from such a principle. The present invention is not limited to a specific configuration disclosed in the embodiment. Therefore, the right to all modifications and changes coming from the scope of claims and the scope of the spirit thereof is claimed.

Description of Symbols

10 . . . plasma processing apparatus, 120 . . . gas supply unit, 121 . . . gas inlet, 122 . . . gas source, 123 . . . gas supply pipe, 124 . . . mass flow controller, 126 . . . open/close valve, 12e . . . exhaust port, 134 . . . wafer loading/unloading port, 136 . . . gate valve, 14 . . . support, 140 . . . radio frequency antenna, 142A . . . inner antenna element, 142B . . . outer antenna element, 144 . . . clamping body, 150A . . . radio frequency power supply, 150B . . . radio frequency power supply, 160 . . . shield member, 162A . . . inner shield wall, 162B . . . outer shield wall, 164A . . . inner shield plate, 164B . . . outer shield plate, 168A . . . actuator, 168B . . . actuator, 18a . . . first plate, 18b . . . second plate, 192 . . . processing container, 194 . . . plate-like dielectric, 22 . . . DC power supply, 23 . . . switch, 24 . . . refrigerant flow path, 26a . . . pipe, 26b . . . pipe, 28 . . . gas supply line, 46 . . . deposition shield, 48 . . . exhaust plate, 50 . . . exhaust device, 52 . . . exhaust pipe, 64 . . . radio frequency power supply, 68 . . . matching unit, Cnt . . . controller, EL . . . etching target layer, ESC . . . electrostatic chuck, FR . . . focus ring, G1 . . . graph, G2 . . . graph, HP . . . heater power supply, HT . . . heater, LE . . . lower electrode, MK . . . mask, MT . . . method, MX . . . mixed layer, PD . . . placing table, SF . . . top surface, Sp . . . processing space, SQ . . . sequence, TH . . . value, TM . . . timing, TR . . . trench, W . . . wafer.

What is claimed is:

1. An apparatus for processing a substrate, the apparatus comprising:
a chamber having at least one gas inlet and at least one gas outlet;
a substrate support disposed in the chamber;
an electrode disposed in the substrate support;
a plasma generator configured to selectively generate a first plasma and a second plasma in the chamber, the first plasma being generated from a first processing gas including a nitrogen gas, the second plasma being generated from a second processing gas including $O_2$ gas and at least one of $NF_3$ gas and $CH_3F$ gas;
a radio frequency bias power supply configured to supply a radio frequency bias power to the electrode; and a controller configured to control the apparatus to perform the following actions:

a) place a substrate on the substrate support, the substrate including a silicon oxide film;

b) modify a portion of the silicon oxide film to form a mixed layer containing nitrogen ions, and to form the mixed layer, the controller is further configured to control the apparatus to:

(i) generate the first plasma with the plasma generator, and (ii) supply the radio frequency bias power to the electrode from the radio frequency bias power supply; and (iii) forming the mixed layer by the plasma of the first processing gas containing nitrogen, on a top surface of the substrate containing silicon oxide, which is exposed through a trench of a mask, the mixed layer containing silicon nitride, c) generate the second plasma with the plasma generator and remove the mixed layer; and thereby maintaining a shape of an opening in the trench of the mask, avoiding deposit formation on the opening, and achieving uniform etching.

2. The apparatus of claim 1, wherein the plasma generator is an inductively coupled plasma (ICP) generator, an electron cyclotron resonance (ECR) plasma generator, a capacitively coupled plasma (CCP) generator, or a microwave plasma generator.

3. The apparatus of claim 1, wherein the at least one gas inlet is located in a side wall portion of the chamber.

4. The apparatus of claim 1, wherein the at least one gas inlet is located in a ceiling portion of the chamber.

5. The apparatus of claim 1, wherein the controller is further configured to control the apparatus to:

purge a space within the chamber after b) and/or c).

6. The apparatus of claim 1, wherein the controller is further configured to control the apparatus to:

d) repeat a sequence including b) and c).

7. The apparatus of claim 1, wherein the controller is further configured to control the apparatus to:

d) generate a third plasma from $O_2$ gas after c).

8. The apparatus of claim 1, wherein the controller is configured to control the apparatus to supply $O_2$ and $NF_3$ gas to the chamber, as the second processing gas.

9. The apparatus of claim 1, wherein the controller is configured to control the apparatus to additionally supply at least $H_2$ gas and Ar gas to the chamber, as part of the second processing gas.

10. The apparatus of claim 1, wherein the controller is configured to control the apparatus to supply at least $O_2$, $CH_3F$ and Ar gas to the chamber as the second processing gas.

11. The apparatus of claim 1, wherein the controller is configured to control the apparatus to place the substrate on the substrate support, wherein the mask is a TiN mask on the silicon oxide film.

12. The apparatus of claim 1, wherein the controller is configured to control the radio frequency bias power supply to supply the radio frequency power in b) in a range from 20 W to 100 W.

13. The apparatus of claim 1, wherein the controller is configured to control the apparatus to form the mixed layer which includes silicon nitride.

14. An apparatus for processing a substrate, the apparatus comprising:

a chamber having at least one gas inlet and at least one gas outlet;

a substrate support disposed in the chamber;

a plasma generator configured to selectively generate a first plasma and a second plasma in the chamber, the first plasma being generated from a first processing gas including a nitrogen gas, the second plasma being generated from a second processing gas including $O_2$ gas and at least one of $NF_3$ gas and $CH_3F$ gas; and a controller configured to control the apparatus to perform the following actions:

a) place a substrate on the substrate support, the substrate including a silicon oxide film;

b) generate the first plasma with the plasma generator and modify a portion of the silicon oxide film to form a mixed layer containing nitrogen ions by forming the mixed layer with the plasma of the first processing gas containing nitrogen, on a top surface of the substrate containing silicon oxide, which is exposed through a trench of a mask, the mixed layer containing silicon nitride; and c) generate the second plasma with the plasma generator and remove the mixed layer, thereby maintaining a shape of the opening in an trench of the mask, avoiding deposit formation on the opening, and achieving uniform etching.

15. The apparatus of claim 14, wherein the second processing gas further includes $H_2$ gas and Ar gas.

16. The apparatus of claim 14, wherein the second processing gas further includes Ar gas.

* * * * *